June 4, 1974 A. R. REINBERG ET AL 3,814,641
PROCESS OF FABRICATING SILICON PHOTOMASK
Filed July 20, 1972

United States Patent Office 3,814,641
Patented June 4, 1974

1 2

3,814,641

PROCESS OF FABRICATING SILICON PHOTOMASK

Alan R. Reinberg, Dallas, and John G. Fish, Richardson, Tex., assignors to Texas Instruments Incorporated, Dallas, Tex.

Filed July 20, 1972, Ser. No. 273,560
Int. Cl. H01l 7/50
U.S. Cl. 156—11 7 Claims

ABSTRACT OF THE DISCLOSURE

An improved "see-through" photomask of silicon patterned on glass is produced by the low-temperature deposition of silicon, followed by the low-temperature deposition of silicon nitride or silicon oxide on the silicon. The nitride or oxide is then patterned by selective etching for use as an etch-resistant mask in the selective etching of the silicon to produce the photomask. Preferably, the nitride or oxide pattern is left on the silicon pattern as an anti-reflection coating.

Figure 1:
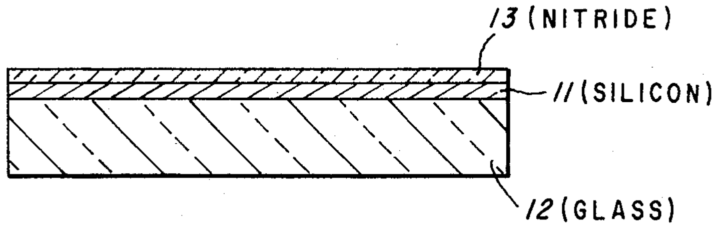

This invention relates to the fabrication of an improved photomask, and more particularly to the fabrication of an improved "see-through" photomask of silicon patterned on glass. The mask selectively blocks ultraviolet light, while it is substantially transparent to visible light, thereby facilitating visual alignment of the photomask with an underlying workpiece.

In the practice of microphotolithographic processes, there is a frequent need for photomasks which selectively block light of a given wavelength, while permitting substantially all visible light to pass, whereby an operator can see through the mask pattern. Thus, with a complete view of the underlying substrate or workpiece, visual alignment of the photomask is more accurate and more rapid than with conventional masks having opaque patterns. In the fabrication of microminiature semiconductor circuits and other semiconductor products, for example, such an improved photomask is very desirable, since higher product yields and increased operator efficiencies are achieved.

Accordingly, it is an object of the invention to provide an improved "see-through" photomask for use in microphotolithographic processes. It is a further object of the invention to provide a method for the fabrication of such a photomask.

A broad aspect of the invention is embodied in a photomask comprising a glass substrate having a silicon film patterned thereon and coated with an anti-reflection film. Although silicon has been used as a photomask material, it has not been entirely successful in the past, probably because of the high temperatures employed in the conventional silane decomposition methods for silicon deposition, such temperatures being sufficiently high to warp glass substrates. In accordance with the present invention, silicon is deposited at temperatures well below temperatures at which the glass substrates would be warped.

The anti-reflection film is preferably selected from silicon nitride, silicon oxide, or a mixture of nitride and oxide. These materials are particularly suitable from the standpoint of fabrication advantages, since they are readily deposited in the same reactor as the initial film of silicon, and since they are also useful as etch-resistant masks for patterning the initially deposited silicon film.

The process embodiments of the invention are concerned initially with the selection of a low-temperature method for depositing the silicon film on a glass substrate. We have found that RF plasma deposition from a gaseous stream of silane in argon is particularly suitable, since a deposition temperature of about 200° C. is optimum.

Subsequently, a thin film of silicon nitride or silicon oxide is formed on the silicon. Preferably, this step is carried out in the same reactor as used for silicon deposition, without removing the coated substrates, by simply changing to the appropriate gas flow and conditions.

A film of photoresist is then patterned on the oxide or nitride layer, in accordance with known techniques. The pattern generated in the resist is the same as ultimately desired in the photomask. Any of the commonly used photoresist compositions are suitable.

Selective etching of the composite film is then carried out in two stages. First, an acid etch is applied, to etch through the nitride or oxide film, followed by the use of a caustic etch to remove the exposed portions of the silicon film. Upon removal of the photoresist, a finished photomask results, with the nitride or oxide layer preferably retained as an anti-reflection coating.

The two-stage etching operation is a substantial improvement over attempts to etch the silicon in a single, direct step of selective etching with the use of a photoresist, due to the superior resolution obtained in the silicon pattern when using the nitride or oxide film as a mask. Apparently, the nitride or oxide is a superior etch mask because it is much thinner than a photoresist film, and more adherent to the silicon.

We have also discovered that RF plasma-deposited silicon is not readily patterned by the acid etches normally employed to pattern amorphous silicon. The RF silicon does readily etch, however, in caustic etches. This permits a silicon nitride pattern to be etched on the silicon using an acid etch, followed by the use of a caustic etch to pattern the silicon. In addition, the silicon nitride layer thickness is chosen so that it behaves as an anti-reflecting coating for the ultraviolet light. This reduces the reflection of the exposing light between the mask and the workpiece eliminating ghost images and increasing the resolution obtainable.

Still further, it is a unique aspect of the preferred embodiment of the invention to use Shipley's AZ positive photoresist in patterning the silicon nitride layer. Thus, upon exposure of the composite film to a caustic etch for patterning the silicon, the AZ resist is concurrently removed, which yields the preferred, nitride-coated, silicon photomask upon rinsing.

FIGS. 1–4 are enlarged cross-sectional views of a glass substrate having various deposited films thereon, illustrating the sequence of steps employed in the fabrication of the improved photomask of the invention.

As shown in FIG. 1 silicon film 11 is deposited on glass substrate 12 by an RF plasma or glow discharge process.

Any of the various known techniques for RF plasma deposition of silicon is suitable for use in practicing the invention. See, for example, the system of U.S. 3,344,055. An example of a preferred deposition system is disclosed in a prior application, U.S. Ser. No. 192,957, filed Oct. 27, 1971, now Pat. No. 3,757,733. The system includes a cylindrical, radial-flow reactor in combination with means for evacuation, a support member for holding the substrates to be coated, concentric tubular members for establishing radial gas flow across the substrates in an inward direction toward a central exhaust port, and electrodes for generating a radio-frequency glow discharge in the reactor. Preferably, the top plate of the reactor serves as one electrode and the support member serves as the other electrode. In the above-described radial-flow reactor, suitable conditions for the deposition include:

Pressure=300 microns
Silane flow rate=250 cm.$^3$/min. of 5% $SiH_4$ in argon
Argon dilutant=400 cm.$^3$/min.
RF power=10 watts
Temperature=200° C.

The silicon film is deposited to a thickness of 500–2000 A., preferably 1000–1500 A.

Silicon nitride film 13 is then deposited on silicon film 11. Preferably the nitride deposition is carried out in the same reactor without interruption. This is readily achieved by changing the dilutant argon to nitrogen and adding 80 cm.$^3$/min. of 10% ammonium-argon to the silicon-comprising gas flow. The pressure and RF power are changed to provide proper conditions for the silicon nitride deposition. A nitride thickness of 300–1000 A. is preferred. When silicon oxide is substituted for nitride, a thickness of 500–1500 A. is preferred, since a somewhat greater oxide thickness is required for anti-reflection purposes.

Figure 2:
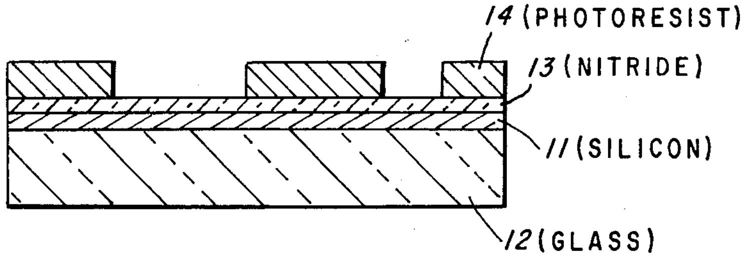

In FIG. 2, a patterned photoresist film 14 is added in accordance with known methods. Preferably, the photoresist film is Shipley's AZ resist, as noted above. The pattern is identical to that desired in the finished photomask.

Figure 3:
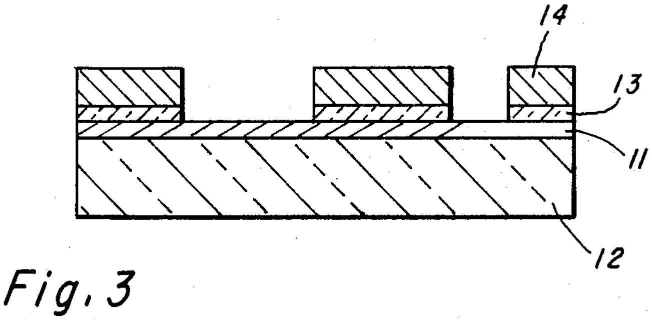

In FIG. 3, the composite film is exposed to an acid etch, such as aqueous HF or Bell #2, for example, which selectively attacks the nitride film at the exposed areas thereof, transferring the pattern of film 14 to nitride film 13.

Figure 4:
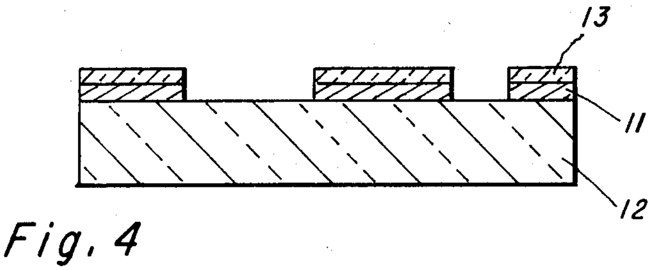

In FIG. 4, the structure of FIG. 3 has been subjected to a caustic etch such as 4 N KOH in methanol or water, for example, whereby the AZ resist is removed, and concurrently the pattern of the nitride film is imparted to the silicon by selective etching to yield the finished photomask.

In addition to its above-noted features, the mask of the invention is very hard, durable, and securely bonded to the glass substrate. The mask increases exposure efficiency and also reduces operator fatigue due to the anti-reflecting nature of the nitride coating. The mask is readily cleaned in a variety of common solvents.

The mask can be further hardened after patterning, for example, by heating at 450° C. for 30 minutes.

Although RF plasma deposition has been emphasized as a useful technique for depositing the silicon film, evaporative deposition of silicon at reduced pressures is also suitable, since substrate temperatures are readily controllable below substrate warping levels.

What is claimed is:

1. A process for fabricating a photomask comprising the steps of:

(a) depositing a film of silicon on a glass substrate;

(b) patterning a film of silicon nitride or silicon oxide on the deposited silicon; and (c) exposing the resulting composite film to an etch which selectively attacks the silicon but not the nitride or oxide, whereby a photomask is produced.

2. A process as in claim 1 wherein the conditions for silicon deposition include:

Pressure=300 microns
Silane flow rate=250 cm.$^3$/min. of 5% $SiH_4$ in argon
Argon dilutant=400 cm.$^3$/min.
RF power=10 watts
Temperature=200° C.

and a silicon film is deposited to a thickness of about 1500 A.

3. A process as in claim 1 wherein silicon nitride is formed on the silicon by RF plasma deposition to a thickness of about 500 A.

4. A process as in claim 1 wherein the silicon film is etched with a hydroxide solution.

5. A process as in claim 1 wherein the silicon film is deposited by evaporation.

6. A process as in claim 1 wherein the silicon nitride or silicon oxide is patterned by the use of an acid etch and a positive photoresist etch mask which is removable by a hydroxide.

7. A process as in claim 6 followed by selective etching of the silicon film with an alkaline etch, whereby the photoresist is concurrently removed.

References Cited

UNITED STATES PATENTS

| | | | |
|---|---|---|---|
| 3,508,982 | 4/1970 | Shearin | 156—17 X |
| 3,635,774 | 4/1972 | Masaya Ohta | 156—17 X |

WILLIAM A. POWELL, Primary Examiner

U.S. Cl. X.R.

156—16, 17